(12) United States Patent
Richardson et al.

(10) Patent No.: US 8,453,030 B2
(45) Date of Patent: May 28, 2013

(54) CODING SCHEMES FOR WIRELESS COMMUNICATION TRANSMISSIONS

(75) Inventors: Thomas Richardson, South Orange, NJ (US); Aamod Khandekar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1067 days.

(21) Appl. No.: 12/446,717

(22) PCT Filed: Oct. 26, 2007

(86) PCT No.: PCT/US2007/082747
§ 371 (c)(1),
(2), (4) Date: Apr. 22, 2009

(87) PCT Pub. No.: WO2008/052202
PCT Pub. Date: May 2, 2008

(65) Prior Publication Data
US 2010/0023834 A1    Jan. 28, 2010

Related U.S. Application Data

(60) Provisional application No. 60/863,116, filed on Oct. 26, 2006.

(51) Int. Cl.
G06F 11/00    (2006.01)
(52) U.S. Cl.
USPC .......................................................... 714/758
(58) Field of Classification Search
USPC .......................................................... 714/758
See application file for complete search history.

(56) References Cited

U.S. PATENT DOCUMENTS

| | | | |
|---|---|---|---|
| 6,126,310 A | 10/2000 | Osthoff et al. |
| 6,421,803 B1 | 7/2002 | Persson et al. |
| 6,646,484 B2 | 11/2003 | Ito |
| 6,938,196 B2 | 8/2005 | Richardson et al. |
| 6,952,113 B2 | 10/2005 | Brown et al. |
| 7,202,703 B2 | 4/2007 | Wijeratne |

(Continued)

FOREIGN PATENT DOCUMENTS

| | | |
|---|---|---|
| CN | 1853380 A | 10/2006 |
| EP | 1156617 A1 | 11/2001 |
| RU | 2216868 C2 | 11/2003 |
| WO | WO0101624 A1 | 1/2001 |
| WO | 2004075023 | 9/2004 |
| WO | WO2004107640 A1 | 12/2004 |

OTHER PUBLICATIONS

Taiwanese Search report—096140473—TIPO—Nov. 21, 2010.

(Continued)

*Primary Examiner* — Scott Baderman
*Assistant Examiner* — Jigar Patel
(74) *Attorney, Agent, or Firm* — Stanton Braden

(57) ABSTRACT

Systems and methodologies are described that facilitate transmitting low-density parity-check encoded communications in a wireless communications network and incrementing such codes in response to requests from receiving devices. The LDPC codes can have associated constraints allowing the codes to be error corrected upon receipt. The requests for incremented codes can be in cases of low transmission power or high interference, for example, where the original code can be too error-ridden to properly decode. In this case, additional nodes can be added to current and/or subsequent communications to facilitate adding a more complex constraint to the LDPC code. In this regard, the large codes can require less validly transmitted nodes to predict error-ridden values as the additional constraint renders less ambiguity in possible node value choices.

46 Claims, 11 Drawing Sheets

U.S. PATENT DOCUMENTS

| | | |
|---|---|---|
| 7,417,482 B2 | 8/2008 | Elgebaly et al. |
| 2003/0023917 A1 | 1/2003 | Richardson et al. |
| 2003/0039218 A1 | 2/2003 | Kwak |
| 2004/0123229 A1 | 6/2004 | Kim et al. |
| 2004/0228320 A1 | 11/2004 | Laroia et al. |
| 2005/0149841 A1 | 7/2005 | Kyung et al. |
| 2006/0107192 A1* | 5/2006 | Mantha et al. ............... 714/800 |
| 2007/0162811 A1 | 7/2007 | Matsumoto |
| 2007/0180345 A1* | 8/2007 | Ismail .......................... 714/752 |

OTHER PUBLICATIONS

International Search Report—PCT/US2007/082747, International Search Authority—European Patent Office—Mar. 5, 2008.

Wen, et al., "On the performance of incremental redundancy hybrid ARQ schemes with rate compatible LDPC codes," 2006 Internationai Conference on Communications, Circuits, and Systems Proceedings, Jun. 2006, pp. 731-734, XP031010535.

Written Opinion—PCT/US07/082747, International Searching Authority—European Patent Office, Mar. 5, 2008.

D. Divsalar et al., "Construction of Protograph LDPC Codes with Linear Minimum Distance," 2006 ISIT, Jul. 9-14, 2006, 5 pages.

Li X., et al., "An Improved Degree Distribution Based HARQ for LDPC", Proceedings of the International Conference on Wireless Communications, Networking and Mobile Computing, 2006. WiCOM 2006, Sep. 22, 2006, pp. 1-4.

* cited by examiner

CODING SCHEMES FOR WIRELESS COMMUNICATION TRANSMISSIONS

CROSS-REFERENCE TO RELATED APPLICATIONS

This application claims the benefit of U.S. Provisional Patent application Ser. No. 60/863,116 entitled "LDPC CODING SCHEME FOR HARQ TRANSMISSION FOR WIRELESS COMMUNICATION SYSTEMS" which was filed Oct. 26, 2006. The entirety of the aforementioned application is herein incorporated by reference.

BACKGROUND

I. Field

The following description relates generally to wireless communications, and more particularly to low density parity check (LDPC) code schemes for hybrid automatic repeat-request (HARQ) transmissions in wireless communications systems.

II. Background

Wireless communication systems are widely deployed to provide various types of communication content such as, for example, voice, data, and so on. Typical wireless communication systems may be multiple-access systems capable of supporting communication with multiple users by sharing available system resources (e.g., bandwidth, transmit power, . . . ). Examples of such multiple-access systems may include code division multiple access (CDMA) systems, time division multiple access (TDMA) systems, frequency division multiple access (FDMA) systems, orthogonal frequency division multiple access (OFDMA) systems, and the like.

Generally, wireless multiple-access communication systems may simultaneously support communication for multiple mobile devices. Each mobile device may communicate with one or more base stations via transmissions on forward and reverse links. The forward link (or downlink) refers to the communication link from base stations to mobile devices, and the reverse link (or uplink) refers to the communication link from mobile devices to base stations. Further, communications between mobile devices and base stations may be established via single-input single-output (SISO) systems, multiple-input single-output (MISO) systems, multiple-input multiple-output (MIMO) systems, and so forth.

In such systems, coding schemes can be desired for transmitting data to facilitate parity checking and/or error correcting the transmission at a receiving device. For example, errors in the transmission can result from low transmission power and from high interference such that some codes of a transmission can be received incorrectly.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In accordance with one or more embodiments and corresponding disclosure thereof, various aspects are described in connection with facilitating communicating low-density parity-check (LDPC) encoded hybrid automatic repeat-request (HARQ) data in a wireless communications network. A receiving device can request an incremented LDPC code where some nodes are not resolvable. In one example, the additional nodes of the incremented LDPC code can be added according to one or more incremental schemes.

According to related aspects, a method that facilitates transmitting LDPC encoded data is described herein. The method can comprise mapping a plurality of bits of a codeword to a plurality of nodes of a selected LDPC code. Additionally, the method can include incrementing the number of nodes in the LDPC code to facilitate unambiguous error correcting thereof, and transmitting the LDPC code as a HARQ transmission.

Another aspect relates to a wireless communications apparatus. The wireless communications apparatus can include at least one processor configured to increment a number of nodes of an LDPC)code comprising a portion of a codeword to be transmitted. The wireless communications apparatus can also include a memory coupled to the at least one processor.

Yet another aspect relates to a wireless communications apparatus that facilitates transmitting LDPC encoded data. The wireless communications apparatus can comprise means for generating an LDPC encoded codeword including a number of core degree 2 accumulate nodes and core degree 3 variable nodes and means for incrementing a number of nodes of the LDPC encoded codeword to facilitate unambiguous decoding thereof. The wireless communications apparatus can further include means for transmitting the LDPC encoded codeword as a HARQ transmission.

Still another aspect relates to a computer program product, which can have a computer-readable medium including code for causing at least one computer to map a plurality of bits of a codeword to a plurality of nodes of a selected LDPC code. The code can also cause the at least one computer to increment the number of nodes in the LDPC code to facilitate unambiguous error correcting thereof and transmit the LDPC code as a HARQ transmission.

In accordance with another aspect, an apparatus in a wireless communication system can include a processor configured to generate an LDPC encoded codeword including a number of explicit parity bits and a number of core degree 2 accumulate nodes, increment a number of nodes of the LDPC encoded codeword to facilitate unambiguous decoding thereof, and transmit the LDPC encoded codeword as a HARQ transmission. Also, the apparatus can include a memory coupled to the processor.

According to a further aspect, a method for receiving and decoding a LDPC encoded transmission is described herein. The method can include receiving an LDPC encoded transmission where at least one node is received in error and requesting an incremental LDPC encoded transmission comprising additional nodes to facilitate correct decoding of the transmission. The method can additionally include error correcting the incremental LDPC encoded transmission based on the additional nodes.

Another aspect relates to a wireless communications apparatus. The wireless communications apparatus can include at least one processor configured to request incremental nodes for an LDPC encoded HARQ transmission where the transmission comprises at least one error, the correction of which is ambiguous. The wireless communications apparatus can also include a memory coupled to the at least one processor.

Yet another aspect relates to a wireless communication apparatus receiving LDPC encoded transmissions. The wireless communications apparatus can include means for receiving an LDPC encoded transmission and means for requesting additional nodes for LDPC encoded transmissions. The wireless communications apparatus can additionally comprise means for receiving an incremental encoded HARQ transmission comprising the additional nodes.

Still another aspect relates to a computer program product, which can have a computer-readable medium including code for causing at least one computer to receive an LDPC encoded transmission where at least one node is received in error. The computer-readable medium can further comprise code for causing the at least one computer to request an incremental LDPC encoded transmission comprising additional nodes to facilitate adding more constraint to the transmission and error correct the incremental LDPC encoded transmission based on the additional nodes.

In accordance with another aspect, an apparatus can be provided in a wireless communication system including a processor configured to receive an LDPC encoded transmission, request additional nodes for LDPC encoded transmissions, and receive an incremental LDPC encoded transmission comprising the additional nodes. Additionally, the apparatus can comprise a memory coupled to the processor.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

Figure 1:
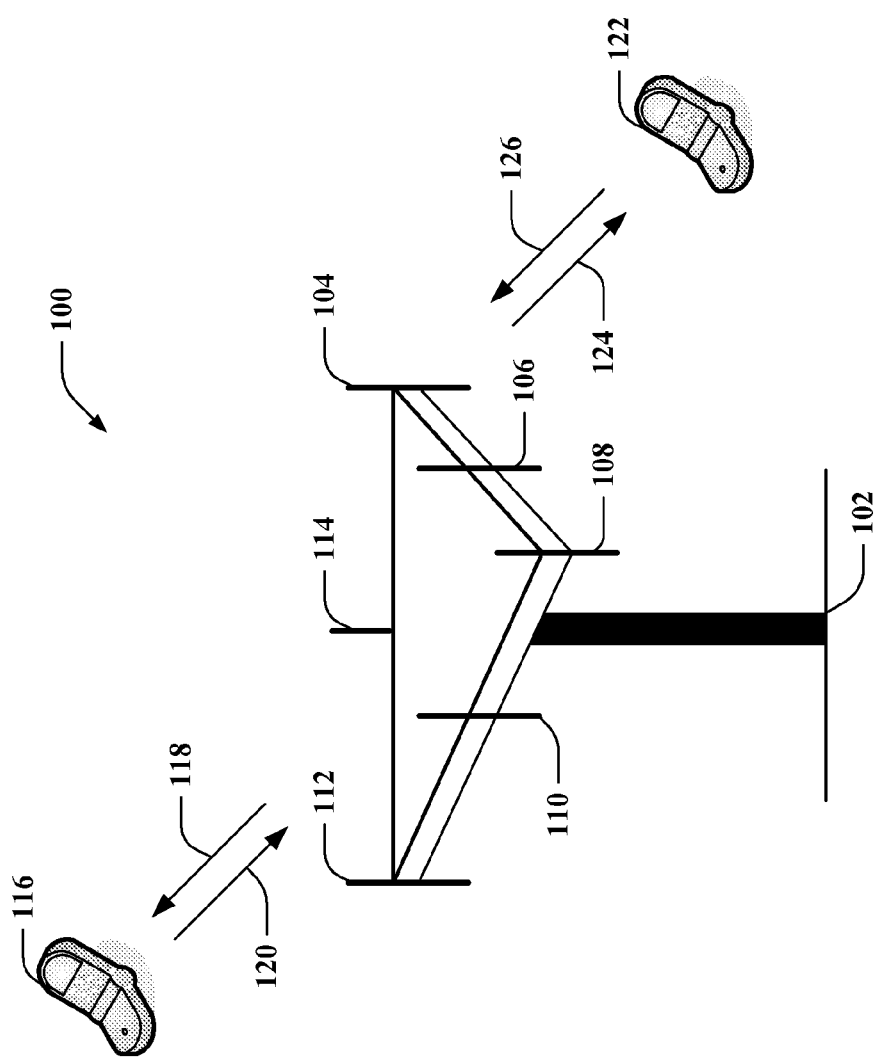
FIG. 1 is an illustration of a wireless communication system in accordance with various aspects set forth herein.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) can be practiced without these specific details. In other instances, well-known structures and devices are shown in block diagram form in order to facilitate describing one or more embodiments.

As used in this application, the terms "component," "module," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Furthermore, various embodiments are described herein in connection with a mobile device. A mobile device can also be called a system, subscriber unit, subscriber station, mobile station, mobile, remote station, remote terminal, access terminal, user terminal, terminal, wireless communication device, user agent, user device, or user equipment (UE). A mobile device can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with mobile device(s) and can also be referred to as an access point, Node B, or some other terminology.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

Referring now to FIG. 1, a wireless communication system 100 is illustrated in accordance with various embodiments presented herein. System 100 comprises a base station 102 that can include multiple antenna groups. For example, one antenna group can include antennas 104 and 106, another group can comprise antennas 108 and 110, and an additional group can include antennas 112 and 114. Two antennas are illustrated for each antenna group; however, more or fewer antennas can be utilized for each group. Base station 102 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 102 can communicate with one or more mobile devices such as mobile device 116 and mobile device 122; however, it is to be appreciated that base station 102 can communicate with substantially any number of mobile devices similar to mobile devices 116 and 122. Mobile devices 116 and 122 can be, for example, cellular phones, smart phones, laptops, handheld communication devices, handheld computing devices, satellite radios, global positioning systems, PDAs, and/or any other suitable device for communicating over wireless communication system 100. As depicted, mobile device 116 is in communication with antennas 112 and 114, where antennas 112 and 114 transmit information to mobile device 116 over a forward link 118 and receive information from mobile device 116 over a reverse link 120. Moreover, mobile device 122 is in communication with antennas 104 and 106, where antennas 104 and 106 transmit information to mobile device 122 over a forward link 124 and receive information from mobile device 122 over a reverse link 126. In a frequency division duplex (FDD) system, forward link 118 can utilize a different frequency band than that used by reverse link 120, and forward link 124 can employ a different frequency band than that employed by reverse link 126, for example. Further, in a time division duplex (TDD) system, forward link 118 and reverse link 120 can utilize a common frequency band and forward link 124 and reverse link 126 can utilize a common frequency band.

Each group of antennas and/or the area in which they are designated to communicate can be referred to as a sector of base station 102. For example, antenna groups can be designed to communicate to mobile devices in a sector of the areas covered by base station 102. In communication over forward links 118 and 124, the transmitting antennas of base station 102 can utilize beamforming to improve signal-to-noise ratio of forward links 118 and 124 for mobile devices 116 and 122. Also, while base station 102 utilizes beamforming to transmit to mobile devices 116 and 122 scattered randomly through an associated coverage, mobile devices in neighboring cells can be subject to less interference as compared to a base station transmitting through a single antenna to all its mobile devices.

According to an example, system 100 can be a multiple-input multiple-output (MIMO) communication system. Further, system 100 can utilize substantially any type of duplexing technique to divide communication channels (e.g., forward link, reverse link, . . . ) such as FDD, TDD, and the like. In one example, the forward and/or reverse link communications can be prone to interference from other communications especially as the capacity of the links is pushed, which can lead to erroneous data swapping between links and therefore faulty decoding of communications. Thus, the communicating devices (e.g. mobile devices 116 and 122 and base station 102) can utilize one or more coding schemes to implement functionalities such as error correcting. In one example, an automatic repeat-request (ARQ) transmission can be used, such as hybrid ARQ (HARQ) where error detection and/or forward error correction information can be transmitted with the data (as part of the message, for example). This can be added for every transmission or in a pattern, interval, at random, etc. Upon receiving an LDCP encoded HARQ transmission the receiver can correct errors in transmission and/or detect the errors according to the LDPC constraints. In addition, the transmitted data may be checked by a cyclic redundancy code (CRC) and/or some other additional redundancy allowing for verification of correct decoding. If the message cannot be predicted or recovered, additional data can be requested, for example.

According to an example, LDPC codes can be used to provide error detecting and/or forward error correcting coding schemes with sufficient error correcting capability to operate channels of a wireless mobile network near capacity. LDPC codes are those whose values can satisfy a low-density parity-check constraint. Typically, the parity-check constraint can be defined by a graph having a plurality of variable nodes, that can take the code value, and a plurality of constraint nodes; each variable node can be connected to one or more constraint nodes such that substantially all values connecting to a constraint node can be required to equal 0 when added to one another modulo 2. Moreover, the parity-check constraint can be represented by a corresponding matrix having rows representing constraint nodes and columns representing variable nodes; a 1 value can represent a link between the nodes and a 0 value represents no link. These codes can be used to transmit data from a base station 102 to one or more mobile devices 116 and 122 or vice versa such that the errors in the received codeword can be corrected by applying one or more LDPC decoding operations. In addition, the transmitting device can add nodes to the codeword, or constraint nodes for example, to create more redundant bits where the receiving device cannot decode the codeword properly due to error in too many portions of the codeword. It is to be appreciated that at some point enough bits of an LDPC code can be transmitted to solve for or correct the error portions of the codeword based on the constraints. Additionally, one or more bits can be punctured, for example. One or more bits can also be known a priori and set (e.g., to 0) at the transmitting and the receiving device. Furthermore, it is to be appreciated that known bits need not be transmitted in one example.

According to an example, lifted LDPC codes can be utilized as well, for example, where in the example above a 1 in the parity check matrix can be modified as an L×L permutation matrix; L can be the lifting factor. Moreover, the lifting can be matched such that the L×L permutation matrices can vary and are chosen from a group of order L (e.g. the matrices can be cyclic shift matrices in one example). The matched lifted LDPC codes can subsequently be parallelized for decoding and encoding to facilitate efficiency. In the graph representation, a lifted LDPC code can be represented by replicating the graph a number of times and connecting the copies by permuting like edges between copies, for instance. This can provide a graph that can be efficiently interpreted by a plurality of processors and/or vector memory, for example. In addition, product liftings can be utilized as well such that a lifting of size n can be a lifting of a number of multipliers whose product is n (e.g., a lifting of size 128 can be a lifting of size 16 followed by 3 liftings of size 2—16×2×2×2=128). This can allow encoding and decoding devices to use disparate parallelism orders in the interest of efficiency, for example. LDPC codes are described herein without reference to lifting; however, it is to be appreciated that the codes can be lifted substantially any number of times to facilitate the parallel processing thereof.

Figure 2:
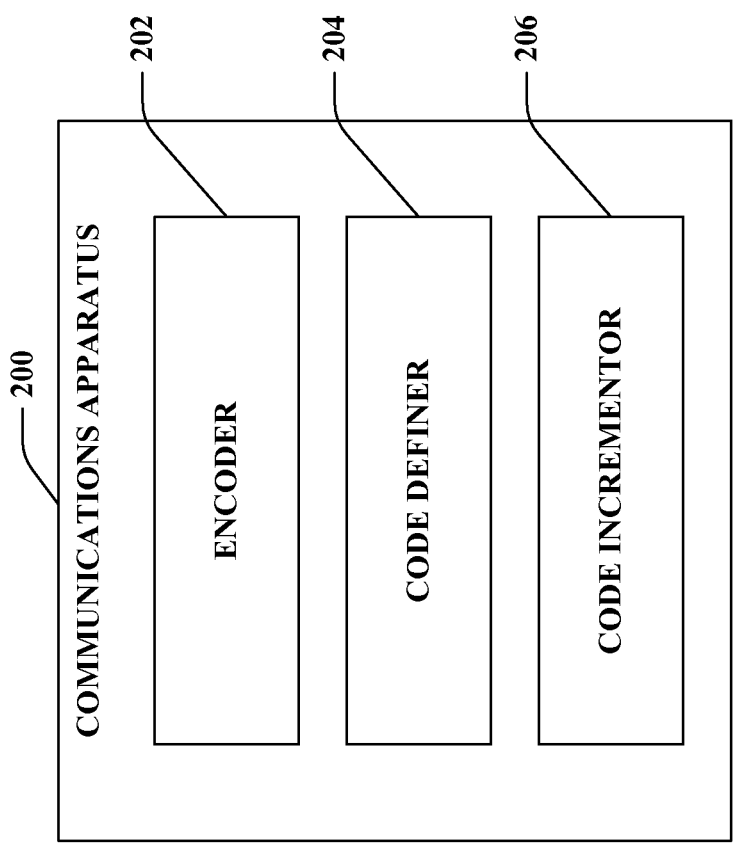
FIG. 2 is an illustration of an example communications apparatus for employment within a wireless communications environment.

Turning to FIG. 2, a communications apparatus 200 for a wireless communications environment is illustrated. Communications apparatus 200 can be a base station, mobile device or a portion thereof, for example. Communications apparatus 200 can comprise an encoder 202 that can encode a data packet into a codeword satisfying one or more parity-check constraints, a code definer 204 that can create a base code related to a coding scheme and a desired data packet size, and a code incrementor 206 to add bits to a code when required for effective decoding thereof by a disparate device. In one example, a message to be transmitted can be transformed into one or more codewords, and the encoder 202 can encode the codeword for transmission pursuant to one or more LDPC coding schemes. The encoder 202 can utilize the code definer 204 to create one or more base codes related to the LDPC schemes for the codeword or portion thereof. The code definer 204 can create a code according to a desired size based on a receiving device, protocol, data to be sent, and/or substantially any variable that can affect the size of a packet to be sent. The base code can have one or more additional nodes or values to specify a constraint on the code as described above; the base code can be transmitted to a device. If the device cannot correctly decode the transmission the communications apparatus 200 can transmit additional bits or codes. The code incrementor 206 can be utilized to add to the codes, and the codeword or the additional portion thereof can be retransmitted. It is to be appreciated that this can persist until the device can correctly decode the codeword.

In one example, a HARQ transmission can be used to send information from the communications apparatus 200 to another device. According to an example, the HARQ scheme can utilize an LDPC code that can be represented as a Tanner graph having variable nodes and constraint nodes. As described in further detail infra, the LDPC code can comprise a core LDPC graph, which can be viewed as subgraph of the full Tanner graph, including one or more variable nodes of degree two and higher together with a number of explicit parity bits. The core LDPC code Tanner graph can comprise, for example, degree 2 variable nodes in an accumulate structure (which can relate to one or more irregular repeat-accumulate (IRA) codes) that can be viewed as a degree two chain or, in parity check matrix form, as a dual-diagonal structure and additional higher degree (e.g., degree 3) variable nodes. The degree 2 chains can be closed, forming loops of degree 2 variable nodes. A lifted LDPC code can include several parallel copies of the accumulate structure so that, for example, several parallel loops can be formed in the case that the accumulate chains are closed. A fraction of the higher degree variable nodes (e.g., $\frac{1}{8}$-$\frac{1}{2}$) can be punctured meaning that the bits associated to those nodes are not necessarily transmitted. In one example, the number of higher degree nodes in the core of the LDPC graph can correspond to the number of information bits in the code. It is to be appreciated, however, that sometimes some of the information bits can be declared known (e.g., set to 0) such that the bits need not be transmitted and can be known a priori at a receiver. In addition to the core LDPC graph the graph can also comprise explicit parity bits. When an explicit parity bit is added to the graph, for instance, it can be added as a degree 1 variable node connected to a single constraint node. The other constraint node's edges can connect to the constraint node to variable nodes already in the graph. The bit associated to the degree 1 variable node can thereby represent the parity of the other bits connected to the constraint node. Since these other bits can include other explicit parity bits, the degree of and explicit parity bit can be larger than 1, for example. With the addition of explicit parity bits the degree of at a least some variable nodes in the core can increase beyond their core values. The degrees of variable nodes associated to previously added explicit parity bits can also increase. Moreover, the degree of a variable node can relate to the number of edges connecting the variable node to one or more constraint nodes in the graph representation or the number of non-zero entries in the parity-check matrix for a given row or column corresponding to the variable nodes. In this regard, the encoder 202 can generate one or more codeword portions corresponding to data to be sent, and the code definer 204 can apply the codeword to variable nodes of the LDPC code (the core degree 3 nodes in one example) to transmit the data.

According to an example, the code definer 204 can begin with a code designed for a first transmission (e.g., using quadrature phase-shift keying (QPSK) with code rate $\frac{1}{2}$) and can transform the codeword to such a code for transmission thereof. If a receiving device is unable to recover the codeword sent (because of excessive interference, for example), additional nodes can be added to the code rendering additional redundancy, thereby making it easier to decode. This can happen for subsequent communications and/or for correcting and resending a current communication. In one example, the additional nodes can be additional explicit parity and/or core degree 2 accumulate nodes. The code incrementor 206 can add an additional variable node as an explicit parity bit of degree 1, in one example, connected to a new constraint node of an arbitrary degree (meaning the constraint node can be connected to other variable nodes as well). In another example, the code incrementor 206 can add a new accumulate core degree 2 variable node that splits a constraint node into two constraint nodes. It is to be appreciated that one of the foregoing can be chosen for a given increment such that one communication can be incremented using either the parity bit or core degree 2 variable node and then using the same or the other the next time around. In this regard, an incrementing scheme can be chosen to maximize efficiency in communication based on known information regarding the communicating devices, historical communication details/preferences, inference techniques, prediction of performance, and/or the like.

Figure 3:
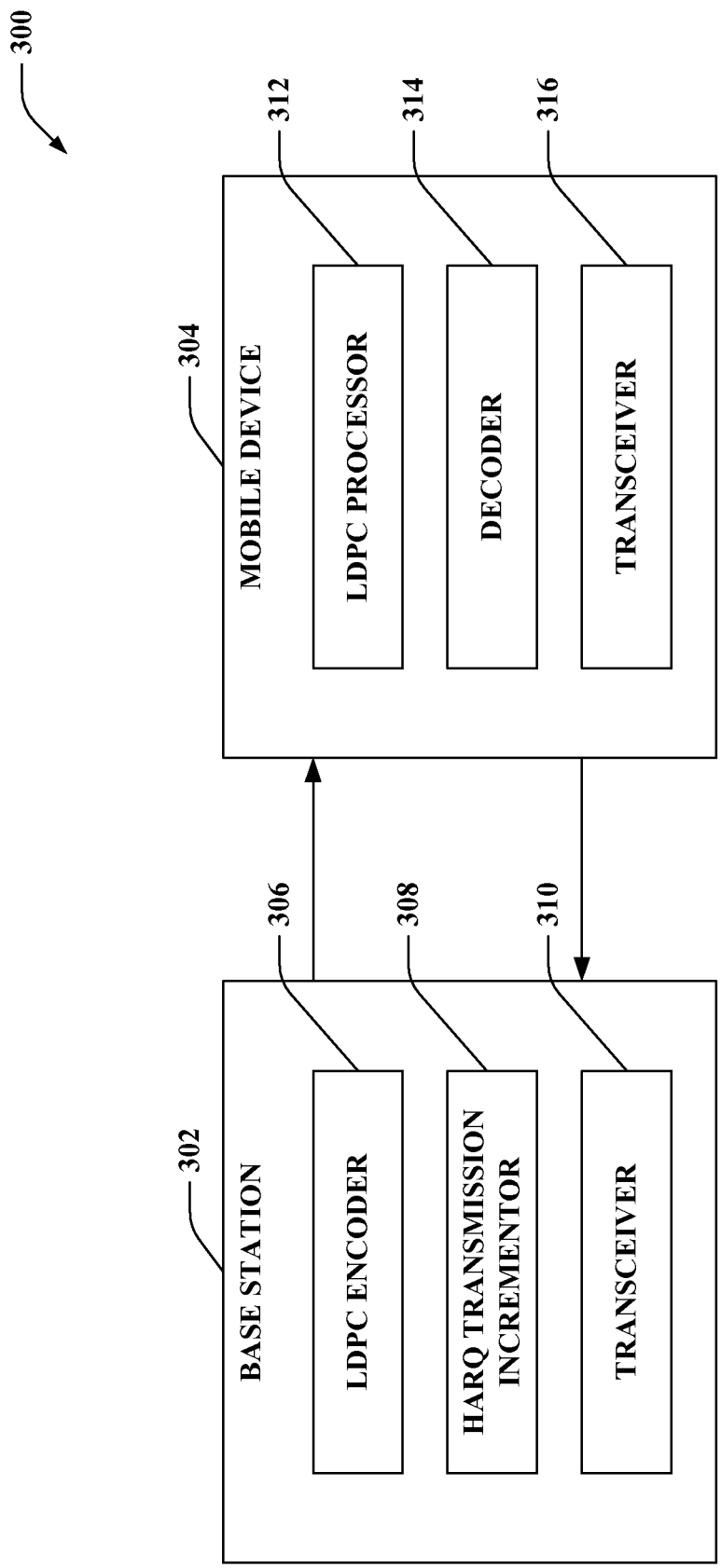
FIG. 3 is an illustration of an example wireless communications system that effectuates communicating incremental codes using hybrid automatic repeat-request (HARQ) transmissions.

Now referring to FIG. 3, a wireless communications system 300 that effectuates communicating using an error correcting coding scheme is illustrated. The wireless communications system 300 includes a base station 302 that communicates with a mobile device 304 (and/or any number of disparate mobile devices (not shown)). The base station 302 can transmit information to the mobile device 304 over a forward link channel, for example; further, the base station 302 can receive information from the mobile device 304 over a reverse link channel and send a forward link acknowledgement to acknowledge the reverse link information and vice versa. Moreover, the wireless communications system 300 can be a MIMO system in one example.

The base station 302 can include an LDPC encoder 306 that can encode one or more codewords related to data transmissions according to an LDPC encoded HARQ transmission as described, a HARQ transmission incrementor 308 that can add bits/nodes to the LDPC encoded HARQ transmission to facilitate reliable communication thereof, and a transceiver 310 to send the HARQ transmission and receive communications, such as that regarding the transmission for example. The mobile device 304 can include an LDPC processor 312 that can process an LDPC encoded HARQ transmission according to its LDPC scheme to facilitate error detection/correction in the transmission, a decoder 314 to decode the packet once the data is verified, and a transceiver 316 to receive the LDPC encoded HARQ transmission and transmit disparate information to the base station 302.

In one example, the base station 302 can desire to transmit data to the mobile device 304 and can utilize the LDPC encoder 306 to transform the data, or a portion thereof, to an LDPC encoded transmission. As described, the code can have a number of explicit parity bits, core degree 2 accumulate bits and core degree 3 bits some of which may be punctured. According to an example, the LDPC code for HARQ transmission, for example, can be defined by a core accumulate structure, as described herein, and a number of core higher-degree nodes (such as degree 3 nodes) where a portion of the nodes are punctured. Moreover, the code in this example can comprise one or more explicit parity bits that can be parities of the punctured nodes, for example. According to an example, the explicit parity bits can be explicit parities of other bits, for example, where a number of core degree 3 punctured nodes can each be represented in more explicit parity bits than a number of core degree 3 non-punctured variable nodes which can be represented in more explicit parity bits than a number of core degree 2accumulate nodes.

The base station 302 can transmit the code, as a HARQ transmission for example, to the mobile device 304 using transceiver 310; the transceiver 316 of the mobile device 304 can receive the code. The LDPC processor 312 can check estimates of the variable nodes of the received code produced (e.g., by LDPC decoding operations) to ensure they satisfy the constraints of the LDPC code associated with the HARQ transmission. The estimates can also be checked by a CRC check, for example. It is to be appreciated, as mentioned, that the LDPC code can be a lifted LDPC code, and the LDPC processor 312 can be a parallel processor used to efficiently decode the LDPC code by utilizing parallel processing, for example. If the LDPC code cannot be decoded and verified in full without ambiguity, the mobile device 304 can request additional bits from the base station 302 (either for this data or subsequent data, for example) by utilizing the transceiver 316 (e.g., over a control channel or other channel). If the code can be verified, the decoder 314 can recover the relevant data for interpretation thereof.

Where more bits are needed in the real-time example, the base station 302 can receive the request for more bits and transmit added variable nodes (e.g., one or more explicit parity bits and/or one or more core degree 2 variable nodes) using the HARQ transmission incrementor 308 to decide which bits to extend and the transceiver 310 to send either the extended bits or the entire code with the added bits, for example. The HARQ transmission incrementor 308 can choose the nodes by which to extend the code according to a number of factors, including a predetermined scheme, inferences made regarding previous transmission, preferences, predicted performance, etc. Incremental redundancy can be added to the HARQ transmission in this regard. Additionally, the request for extra bits can indicate a lower rate of transmission; thus, for subsequent transmissions, the HARQ transmission incrementor 308 can add the bits to the subsequent codes prior to transmitting over transceiver 310.

As described previously, the HARQ transmission incrementor 308 can add the additional variable nodes as an explicit parity bit of degree 1 connected to a new constraint node of an arbitrary degree (meaning the constraint node can be connected to other variable nodes as well) or as a new accumulate core degree 2 variable node that splits a constraint node into two constraint nodes. It is to be appreciated that the HARQ transmission incrementor 308 can increment the code using one or more bits corresponding to either of the above examples; thus, additional bits can be of either type such that one incrementing can use additional nodes of both types. In this regard, an incrementing scheme can be chosen to maximize efficiency in communication based on known information regarding the communicating devices, historical communication details/preferences, inference techniques, predicted performance, and/or the like. It is to be appreciated that in addition or alternatively to incrementing an LDPC code, an LDPC code can be transmitted in sections or chunks until effectively received. Thus, instead of incrementally generating and adding nodes, the nodes can be predefined and sent a portion at a time such that a portion might be effectively decodable.

Figure 4:
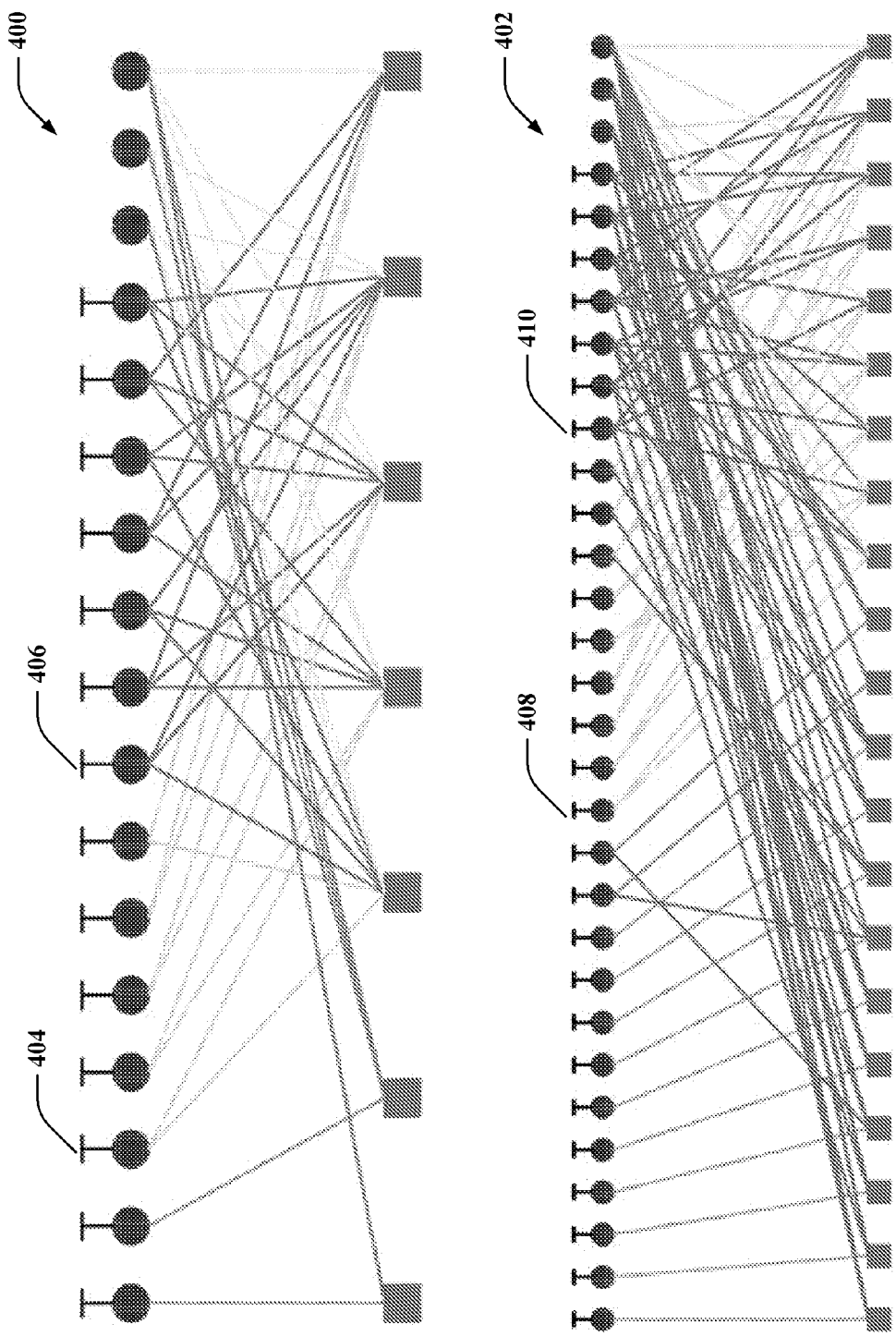
FIG. 4 is an illustration of an example low-density parity-check (LDPC) code and a related incremental code.

Now referring to FIG. 4, example bipartite (or Tanner) graphs 400 and 402 are shown respectively representing an LDPC code for HARQ transmission and an incremented version thereof. The circular nodes can represent the variable nodes as described herein, and the square nodes can represent constraint nodes. In one example, the graph 400 can represent a multiple edge type base structure LDPC code where the first two bits can represent explicit parity bits, the next five bits, starting at 404, can be accumulate core degree 2 bits, the next seven bits, starting at 406 can be core degree 3 transmitted bits, and the remaining three can be core degree 3 state variables. The state variables can be punctured nodes. The multiple edges are represented by the lines from the variable nodes to the constraint nodes.

As described previously, the core degree 3 core state variable nodes (having three edges each in the core) beginning at 406 can comprise a portion of the data to be transmitted from one device to another in a wireless communications environment. The punctured bits are not actually transmitted and must be inferred by the receiver from the transmitted bits. The accumulate core degree 2 nodes, beginning at 404, can be chosen in a manner similar to an IRA code such that the entire code can satisfy the LDPC constraints on the graph 400 (e.g., that for each constraint the summation modulo 2 of bits associated to the connected variable nodes=0). Thus, the core degree 2 nodes will be parity bits in the code. It is to be appreciated that some core degree 2 variable nodes can correspond to data bits and some degree 3 variable nodes can correspond to parity bits. If a receiving device can decode the variable node values based on the received signal using LDPC decoding processing, then the data can be recovered. If, however, more information is needed, the graph 402 can be utilized to transmit additional redundant bits (and/or may be utilized for subsequent communications, for example).

In graph 402, fourteen nodes have been added to the original graph (essentially double the size not counting the punctured bits) where the number of core degree 3 nodes has not changed, since those nodes are the data nodes. Utilizing the extra node increments described above, ten explicit parity bits, along with ten constraint nodes (having an arbitrary number of edges) are added to the front of the sequence, and the core degree 2 accumulate nodes start at 408 in graph 402. Additionally, four accumulate 2 nodes were added, and four corresponding constraint nodes were split into two constraint nodes yielding four additional constraint nodes. Thus, fourteen new variable nodes and fourteen new constraint nodes are added to the communication to add further redundancy to the LDPC code making it easier to solve as the error (or incorrect portion of nodes) increases. If a further extension is needed, additional explicit parity bits and/or additional core degree 2 accumulate bits can be added. Similarly, an increment might consist of 7 additional nodes, the larger graph therefore representing the LDPC code associated to two additional increments in this example. The two increments can each comprise some explicit parity bits and some core degree 2 bits. The selection of bits for each increment can be based on optimizing predicted performance for each increment, for example.

According to an example, codes can be extended and lifted to meet required specifications. For example, a block-hopped OFDM transmission can be provided, which can comprise of 128 degrees of freedom and employ 18 degrees of freedom for pilot overhead for each given block. A first transmission utilizing 8 such blocks (and employing QPSK modulation with rate ½) can additionally be provided. Thus, according to the example, the data segment size can be 1*128*8*(1−18/128)=880 bits. Therefore, a (1760,880) code can be sent at the first transmission. To generate such a code, a (14,7) base code (having 14 non-punctured nodes and 7 core degree 3 nodes) similar to the (14,10) code in 402 can be used. Using a lifting of 128, a (14*128,7*128)=(1792,896) code can be generated from the (14,7) code. From this code, 32 coded bits can be punctured (the 32 right most explicit parity bits in one example) and 16 punctured information bits can be declared known (e.g., set to 0) yielding the desired (1760,880) code. Alternatively, 16 coded bits can be punctured (the 16 right most explicit parity bits in one example) and 16 non-punctured information bits can be declared known (e.g., set to 0) again yielding the desired (1760,880) code. It is to be appreciated that the selection of punctured and known bits can be known to the receiver a priori.

Figure 5:
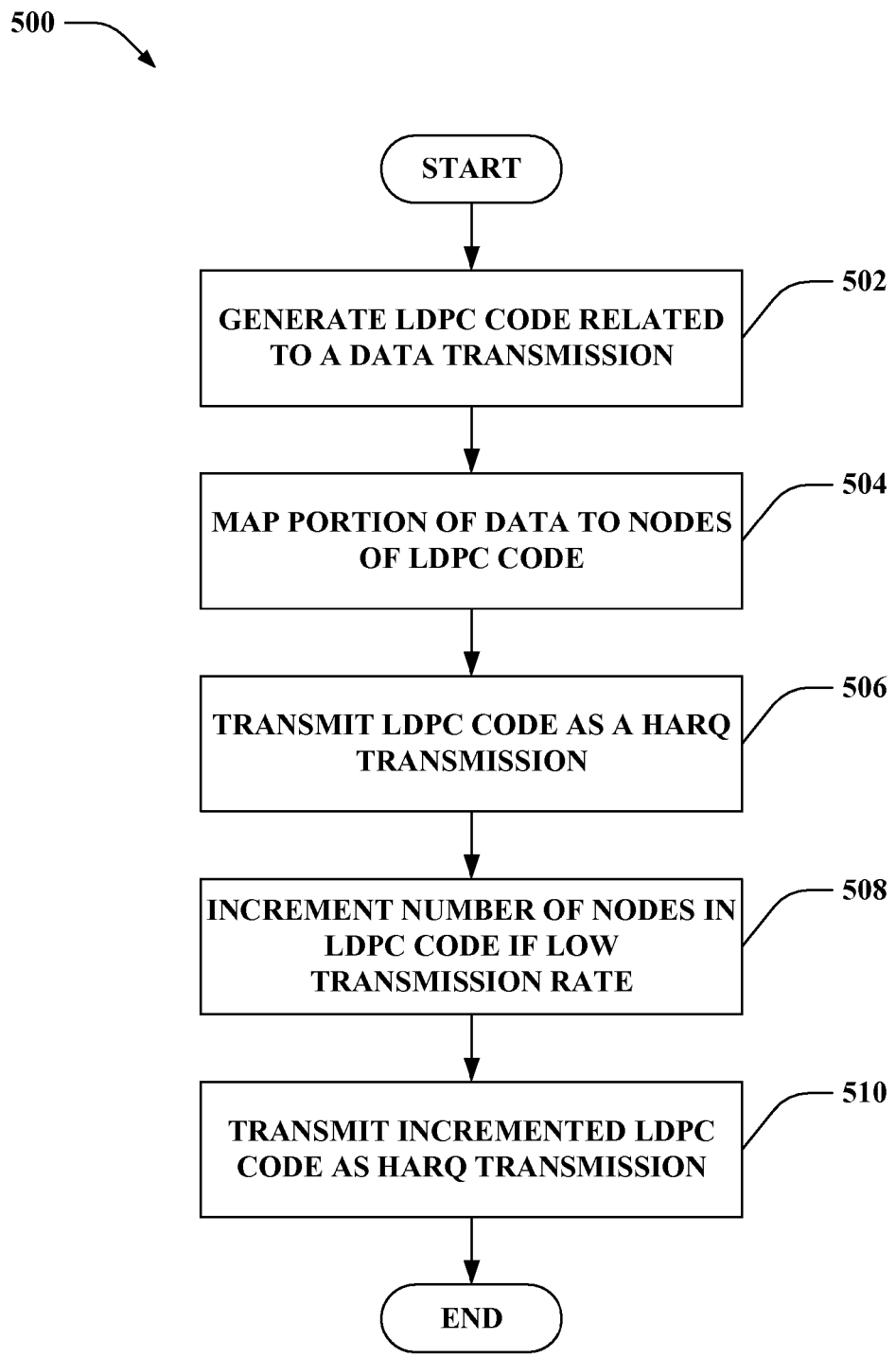
FIG. 5 is an illustration of an example methodology that facilitates transmitting an incremental code.
Figure 6:
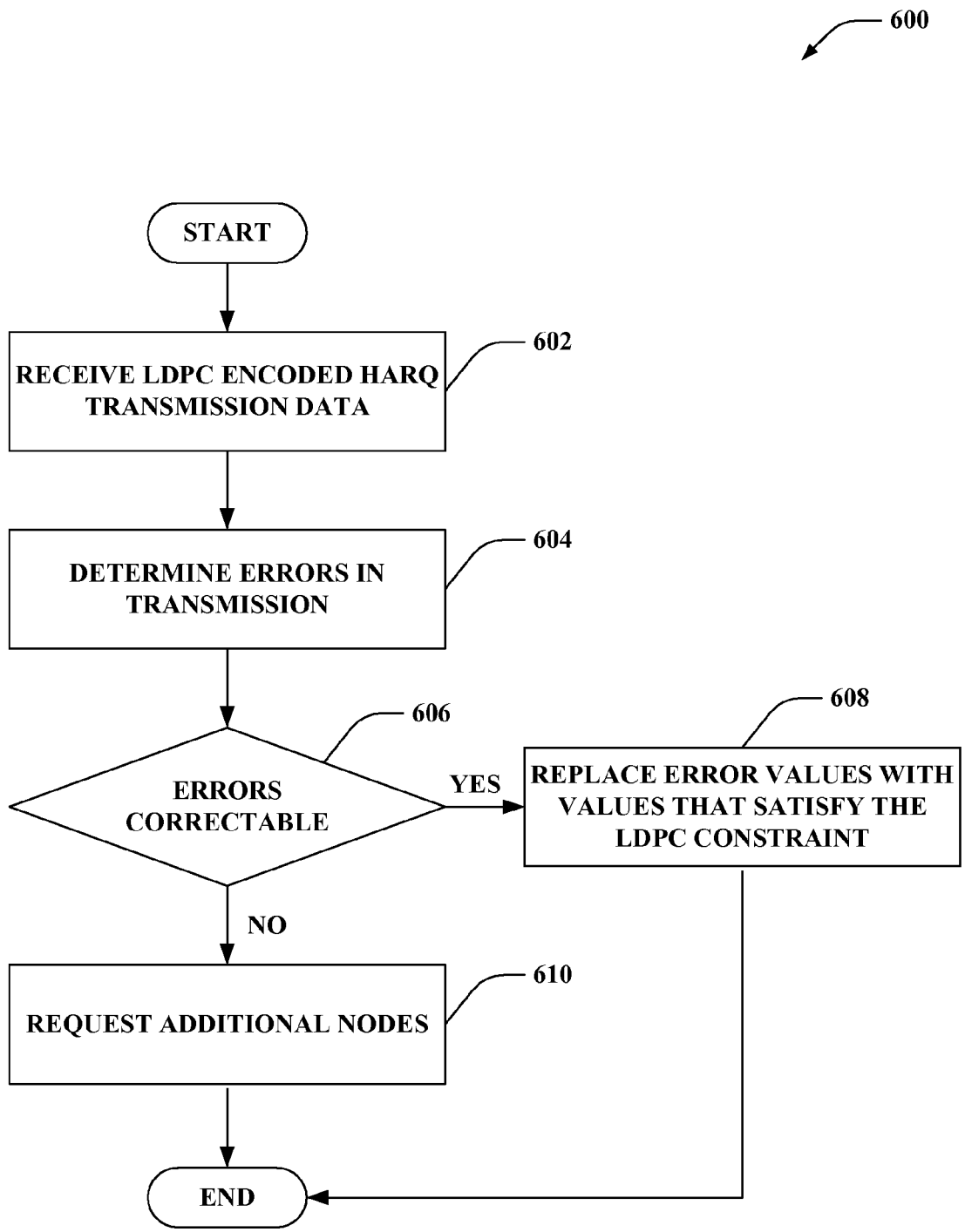
FIG. 6 is an illustration of an example methodology that facilitates error correcting an incremental code.

Referring to FIGS. 5-6, methodologies relating to generating and interpreting LDPC encoded HARQ transmissions are illustrated. While, for purposes of simplicity of explanation, the methodologies are shown and described as a series of acts, it is to be understood and appreciated that the methodologies are not limited by the order of acts, as some acts may, in accordance with one or more embodiments, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more embodiments.

Now referring to FIG. 5, a methodology 500 that facilitates generating and incrementing an LDPC encoded HARQ transmission is illustrated. At 502, an LDPC code related to a data transmission is generated. As described above, this can occur upon determining a portion of a message or codeword to send to a disparate device. The LDPC code to utilize can relate to a requirement of transmission, such as a packet size, for example. At 504, a portion of data is mapped to the nodes of the LDPC code. For example, the data can be largely mapped to the core degree 3 nodes as described, and additional values for the other nodes can be chosen so that the data mapped to the nodes satisfies the constraint of the LDPC code. At 506, the LDPC code is transmitted as a HARQ transmission to a disparate device, for instance; this can be a base station and/or mobile device, for example.

At 508, the number of nodes in the LDPC code can be incremented in the case of low transmission rate with the disparate device. This can be for communications channels having high interference or signal-to-noise ratios (SNR), far away devices, etc. In this case, a decoding device might not be able to effectively decode the data as it cannot properly solve for nodes which it received in error. This can be because it did not receive enough valid nodes or with sufficient reliability to predict the invalid nodes based on the constraints of the LDPC code. Thus, the device can request additional nodes, and the transmitting device can increment the number of nodes in the current and/or subsequent communications. Additionally, the nodes can be incremented, as described supra, by adding an explicit parity-constraint node pair and/or by extending the dual-diagonal structure of core degree 2 accumulate nodes and splitting a corresponding constraint node into two nodes. At 510, the subsequent or current incremented LDPC code can be transmitted as a HARQ transmission.

With reference to FIG. 6, a methodology 600 that facilitates receiving and processing LDPC encoded HARQ data is displayed. At 602, LDPC encoded data, as described above, is received. The data can be associated to a plurality of nodes with additional nodes having values that satisfy the LDPC code constraints. As described, the LDPC code can be defined by a parity-check matrix and/or a corresponding graph and can require that bits associated to particular subsets of nodes in certain locations represented by the matrix and/or graph add up, modulo 2, to 0, for example. At 604, errors in transmission are determined; for example, nodes of the coded data can be received in error and/or are not correctable due to one or more factors including, but not limited to, line interference, SNR, low transmission power, and the like.

At 606, the errors are evaluated to determined if they are correctable. For example, nodes not properly received can be predicted, in some cases, according to the constraints of the LDPC code. For example, LDPC decoding processing can produce an estimate for each node value, and those values can be checked to verify that at least some of the LDPC parity check constraints are satisfied. The data can comprise a CRC check, which could be used to verify correct decoding of the data. If decoding is not successful, additional nodes can be requested for this or another data packet at 610. It is to be appreciated that repetitive requests can be requested in addition or instead (or for the original communication and additional nodes are sent in subsequent transmissions, for example). Where additional nodes are requested, the code can be extended to include one or more nodes as described above. This creates a longer more redundant code and allows for larger proportional corruption; thus, data can be recovered with a lesser fraction of reliably correctly received nodes.

It will be appreciated that, in accordance with one or more aspects described herein, inferences can be made regarding schemes for modulating the symbol among a plurality of such symbols in a mutually orthogonal cluster as well as multicasting the symbol over a plurality of frequency regions. As used herein, the term to "infer" or "inference" refers generally to the process of reasoning about or inferring states of the system, environment, and/or user from a set of observations as captured via events and/or data. Inference can be employed to choose LDPC codes for encoding the data and/or to determine which type of node to add during an incrementing step, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

According to an example, one or more methods presented above can include making inferences pertaining to selecting whether to increment a HARQ transmission by adding an explicit parity bit and corresponding constraint node, or an accumulate core degree 2 node along with splitting a current constraint node to an associated LDPC code. This can include evaluating historical and/or similar communications to determine a most efficient mechanism, which can be based per device (e.g., unique to a give device or a brand of device), per communicating network, per signal strength, per distance from a transmitting device, performance prediction etc. By way of further illustration, an inference can be made regarding the LDPC code chosen for the data or the manner in which the data is divided or mapped into the LDPC encoded HARQ transmission, for example. It is to be appreciated that the foregoing examples are illustrative in nature and are not intended to limit the number of inferences that can be made or the manner in which such inferences are made in conjunction with the various embodiments and/or methods described herein.

Figure 7:
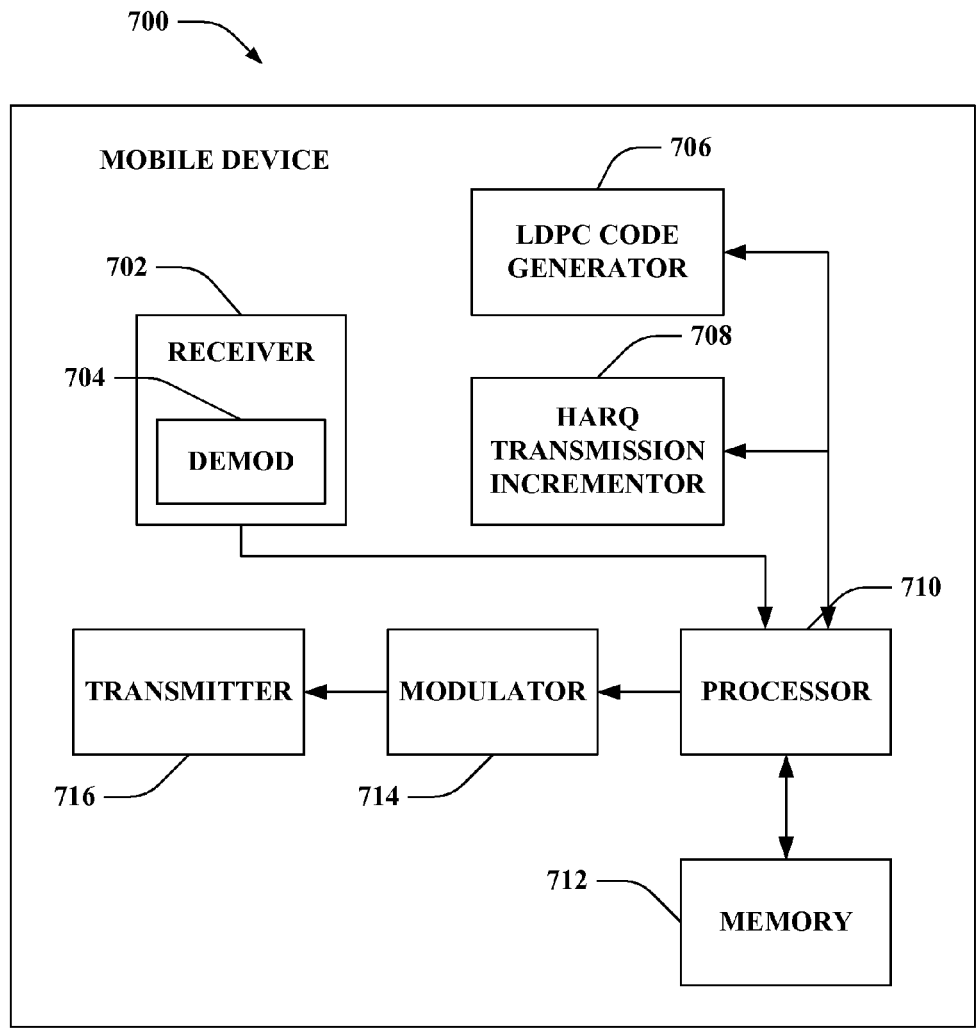
FIG. 7 is an illustration of an example mobile device that facilitates communicating incremental codes.

FIG. 7 is an illustration of a mobile device 700 that facilitates communicating LDPC encoded HARQ data to one or more disparate devices, in a MIMO system for example. Mobile device 700 comprises a receiver 702 that receives a signal from, for instance, a receive antenna (not shown), and performs typical actions thereon (e.g., filters, amplifies, downconverts, etc.) and digitizes the conditioned signal to obtain samples. Additionally, the mobile device 700 can comprise a demodulator 704 that can demodulate received information and transfer such to a processor 710 for example. Also, an LDPC code generator 706 is provided to create an LDPC code and assign desired values of a codeword to be sent to the code, as well as a HARQ transmission incrementor 708 that can increment the LDPC encoded HARQ transmission for times or areas of low transmission power. Processor 710 can be a processor dedicated to analyzing information received by receiver 702 and/or generating information for transmission by a transmitter 716, a processor that controls one or more components of mobile device 700, and/or a processor that analyzes information received by receiver 702, generates information for transmission by transmitter 716, and controls one or more components of mobile device 700.

Mobile device 700 can additionally comprise memory 712 that is operatively coupled to processor 710 and that can store data to be transmitted, received data, information related to available channels, data associated with analyzed signal and/or interference strength, information related to an assigned channel, power, rate, or the like, and any other suitable information for estimating a channel and communicating via the channel. Memory 712 can additionally store protocols and/or algorithms associated with estimating and/or utilizing a channel (e.g., performance based, capacity based, etc.). Moreover, the memory 712 can store information related to creating LDPC codes and incrementing such codes by at least one of adding a parity-constraint node pair or adding a core degree 2 accumulate node and splitting a corresponding constraint node into one or more additional nodes, for example.

It will be appreciated that the data store (e.g., memory 712) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 712 of the subject systems and methods is intended to comprise, without being limited to, these and any other suitable types of memory.

According to an example, the processor can utilize the LDPC code generator 706 to encode a codeword, or a portion thereof, for transmitting. The LDPC code generator 706 can map the values of the codeword to certain nodes of an LDPC code and specify values for other nodes that allow the totality of nodes to fulfill a constraint on the LDPC code. The LDPC code can be transmitted, as a HARQ transmission for example, using the transmitter 716 (e.g., after being modulated by the modulator 714) to one or more disparate devices. The devices can return information regarding the communications that can be received by the receiver 702, for example. The information can comprise, for example, a request for additional nodes where the communication is subject to high interference such that the receiving device did not properly receive the entire code and cannot predict the missing or error nodes. The additional nodes requested can create a more complex code with respect to satisfying the constraint rendering the code more deterministic with a lower number of available nodes.

The HARQ transmission incrementor 708 can determine which nodes to add (parity-constraint combination or new accumulate core degree 2 nodes with split constraint) when and where. For example, the HARQ transmission incrementor 708 can add a given number of nodes (in the current and/or subsequent communications) where the number can be partially explicit parity-constraint nodes and partially accumulate core degree 2 and constraint split type nodes. The type of node chosen for a given iteration can be based on a number of factors including, but not limited to, a predetermined scheme, historical iterations, information from one or more mobile devices or base stations, a communication signal strength, distance of devices, carrier network, inference technologies, performance prediction, and/or the like. The incremented code can be transmitted in full, or in relevant part as a HARQ transmission, by utilizing the transmitter 716 (and the modulator 714 to modulate the transmission).

Figure 8:
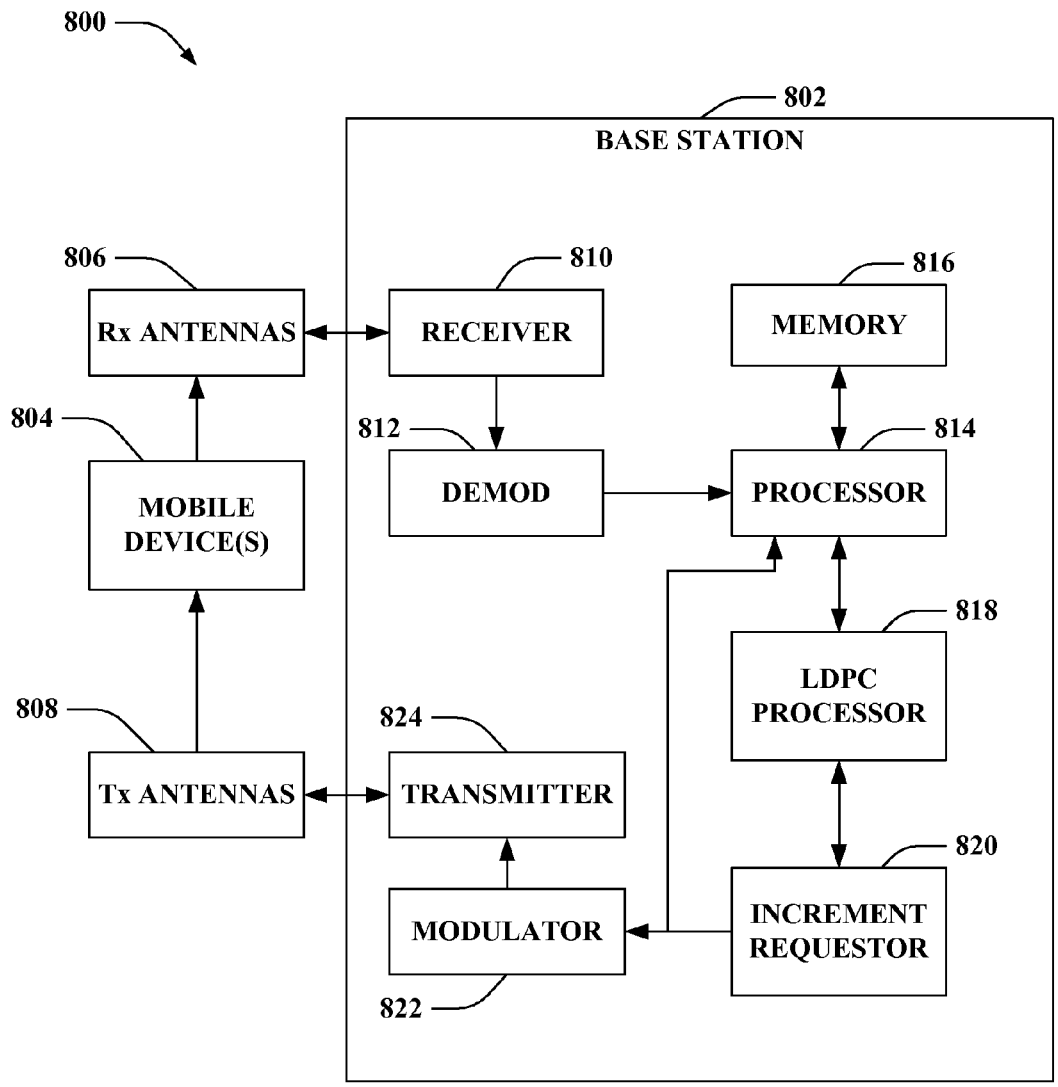
FIG. 8 is an illustration of an example system that facilitates requesting and processing an incremented code.

FIG. 8 is an illustration of a system 800 that facilitates receiving and decoding LDPC encoded HARQ communications in a MIMO environment, for example. System 800 comprises a base station 802 (e.g., access point, . . . ) with a receiver 810 that receives signal(s) from one or more mobile devices 804 through a plurality of receive antennas 806, and a transmitter 824 that transmits to the one or more mobile devices 804 through a transmit antenna 808. Receiver 810 can receive information from receive antennas 806 and is operatively associated with a demodulator 812 that demodulates received information. Demodulated symbols are analyzed by a processor 814 that can be similar to the processor described above with regard to FIG. 7, and which is coupled to a memory 816 that stores information related to estimating a signal (e.g., pilot) strength and/or interference strength, data to be transmitted to or received from mobile device(s) 804 (or a disparate base station (not shown)), and/or any other suitable information related to performing the various actions and functions set forth herein. Processor 814 is further coupled to an LDPC processor 818, which can be a portion of the processor 814 in one example, that can parallelize one or more LDPC codes for efficient and asynchronous processing thereof. The processor 814 is also coupled to an increment requestor 820 that can request additional LDPC code nodes where a previous transmission is not decodable (due to error) or correctable as described herein.

According to an example, the base station 802 can receive an LDPC encoded HARQ transmission from one or more mobile devices 804 via Rx antennas 806. The receiver 810 can receive the transmission and demodulate it using the demod 812. The processor 814 can receive the transmission and leverage the LDPC processor 818 to decode the transmission. For example, the LDPC encoded HARQ transmission can have an associated set of constraints defining the code; the constraints can be represented by a parity-constraint matrix or a graph that and it can be lifted by a factor of L. Thus, the LDPC processor 818 can comprise a number of processing elements (L in an optimal case) to utilize in parallelizing processing of the LDPC encoded signal; each processing element can process at least one LDPC node. In one example, the LDPC encoded HARQ transmission can be received with errors such that not all nodes or bits are properly received. The parallel LDPC processing described can allow the base station 802 to efficiently correct the errors, if unambiguously possible, by finding values that satisfy the LDPC constraints.

If the LDPC encoded signal cannot be decoded by the LDPC processor 818, the increment requester 820 can be utilized to request additional nodes (e.g., of one or more LDPC codes) in connection with the current and/or subsequent requests. The additional nodes can be utilized in low transmission power or high interference configurations to make LDPC encoded signal more easily decodable. As described, the additional nodes can be added as explicit parity bits having a corresponding new constraint node of arbitrary degree and/or accumulate core degree 2 nodes with a split constraint node. Thus, the additional nodes add additional redundancy such that a lower proportion of reliably correctly received nodes are necessary to unambiguously correct error nodes received. The increment requester 820 can request additional nodes as many times as is necessary to correctly decode the HARQ transmission. Additionally, as mentioned, the additional nodes for a current transmission can be sent alone or in the entirety along with the nodes already sent, or with a portion of nodes already sent, in one example.

Figure 9:
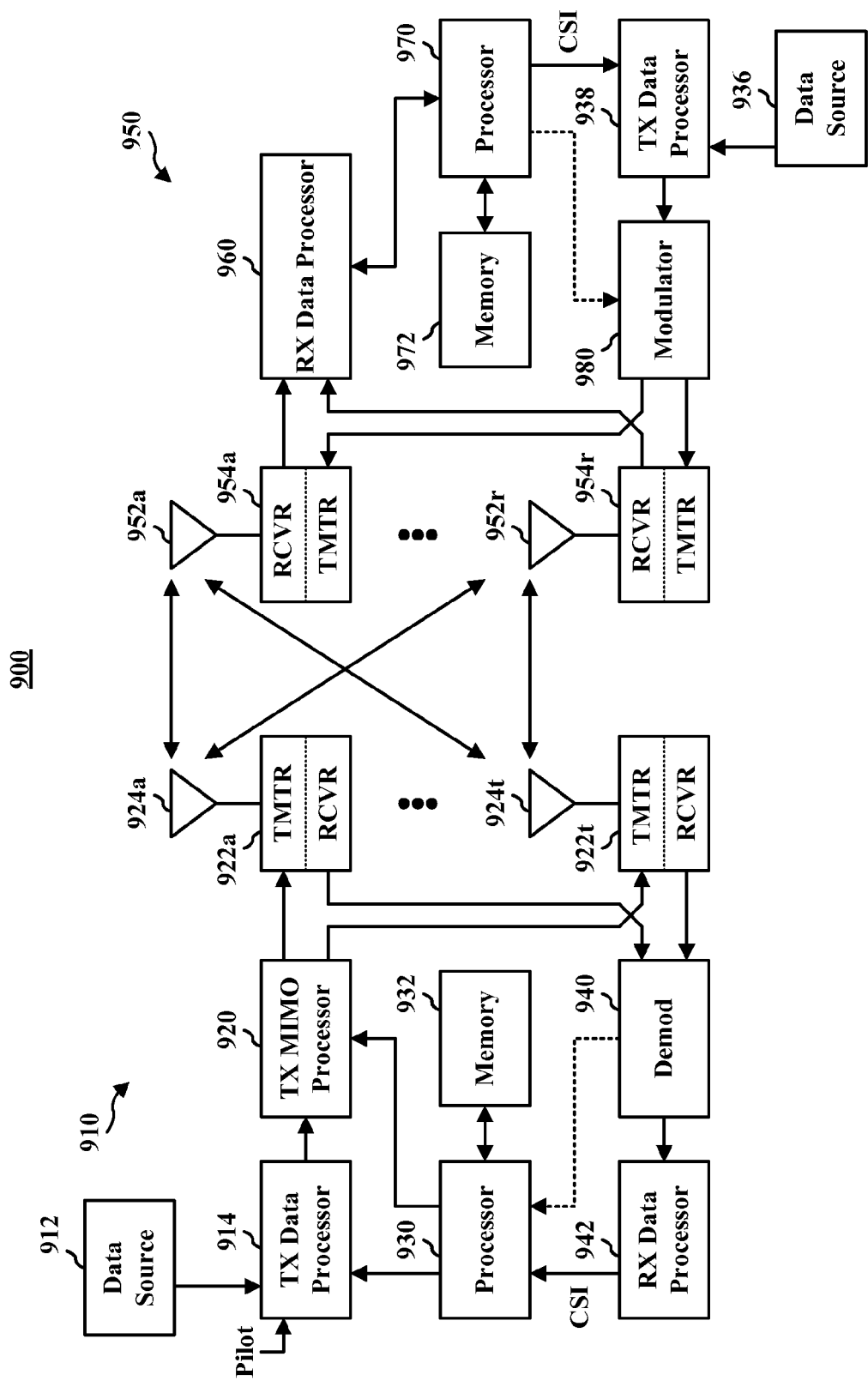
FIG. 9 is an illustration of an example wireless network environment that can be employed in conjunction with the various systems and methods described herein.

FIG. 9 shows an example wireless communication system 900. The wireless communication system 900 depicts one base station 910 and one mobile device 950 for sake of brevity. However, it is to be appreciated that system 900 can include more than one base station and/or more than one mobile device, wherein additional base stations and/or mobile devices can be substantially similar or different from example base station 910 and mobile device 950 described below. In addition, it is to be appreciated that base station 910 and/or mobile device 950 can employ the systems (FIGS. 1-3 and 7-8), techniques/configurations (FIG. 4) and/or methods (FIGS. 5-6) described herein to facilitate wireless communication there between.

At base station 910, traffic data for a number of data streams is provided from a data source 912 to a transmit (TX) data processor 914. According to an example, each data stream can be transmitted over a respective antenna. TX data processor 914 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 950 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 930.

The modulation symbols for the data streams can be provided to a TX MIMO processor 920, which can further process the modulation symbols (e.g., for OFDM). TX MIMO processor 920 then provides $N_T$ modulation symbol streams to $N_T$ transmitters (TMTR) 922a through 922t. In various embodiments, TX MIMO processor 920 applies beamforming weights to the symbols of the data streams and to the antenna from which the symbol is being transmitted.

Each transmitter 922 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 922a through 922t are transmitted from $N_T$ antennas 924a through 924t, respectively.

At mobile device 950, the transmitted modulated signals are received by $N_R$ antennas 952a through 952r and the received signal from each antenna 952 is provided to a respective receiver (RCVR) 954a through 954r. Each receiver 954 conditions (e.g., filters, amplifies, and downconverts) a respective signal, digitizes the conditioned signal to provide samples, and further processes the samples to provide a corresponding "received" symbol stream.

An RX data processor 960 can receive and process the $N_R$ received symbol streams from $N_R$ receivers 954 based on a particular receiver processing technique to provide $N_T$ "detected" symbol streams. RX data processor 960 can demodulate, deinterleave, and decode each detected symbol stream to recover the traffic data for the data stream. The processing by RX data processor 960 is complementary to that performed by TX MIMO processor 920 and TX data processor 914 at base station 910.

A processor 970 can periodically determine which precoding matrix to utilize as discussed above. Further, processor 970 can formulate a reverse link message comprising a matrix index portion and a rank value portion.

The reverse link message can comprise various types of information regarding the communication link and/or the received data stream. The reverse link message can be processed by a TX data processor 938, which also receives traffic data for a number of data streams from a data source 936, modulated by a modulator 980, conditioned by transmitters 954a through 954r, and transmitted back to base station 910.

At base station 910, the modulated signals from mobile device 950 are received by antennas 924, conditioned by receivers 922, demodulated by a demodulator 940, and processed by a RX data processor 942 to extract the reverse link message transmitted by mobile device 950. Further, processor 930 can process the extracted message to determine which precoding matrix to use for determining the beamforming weights.

Processors 930 and 970 can direct (e.g., control, coordinate, manage, etc.) operation at base station 910 and mobile device 950, respectively. Respective processors 930 and 970 can be associated with memory 932 and 972 that store program codes and data. Processors 930 and 970 can also perform computations to derive frequency and impulse response estimates for the uplink and downlink, respectively.

It is to be understood that the embodiments described herein can be implemented in hardware, software, firmware, middleware, microcode, or any combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

When the embodiments are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

Figure 10:
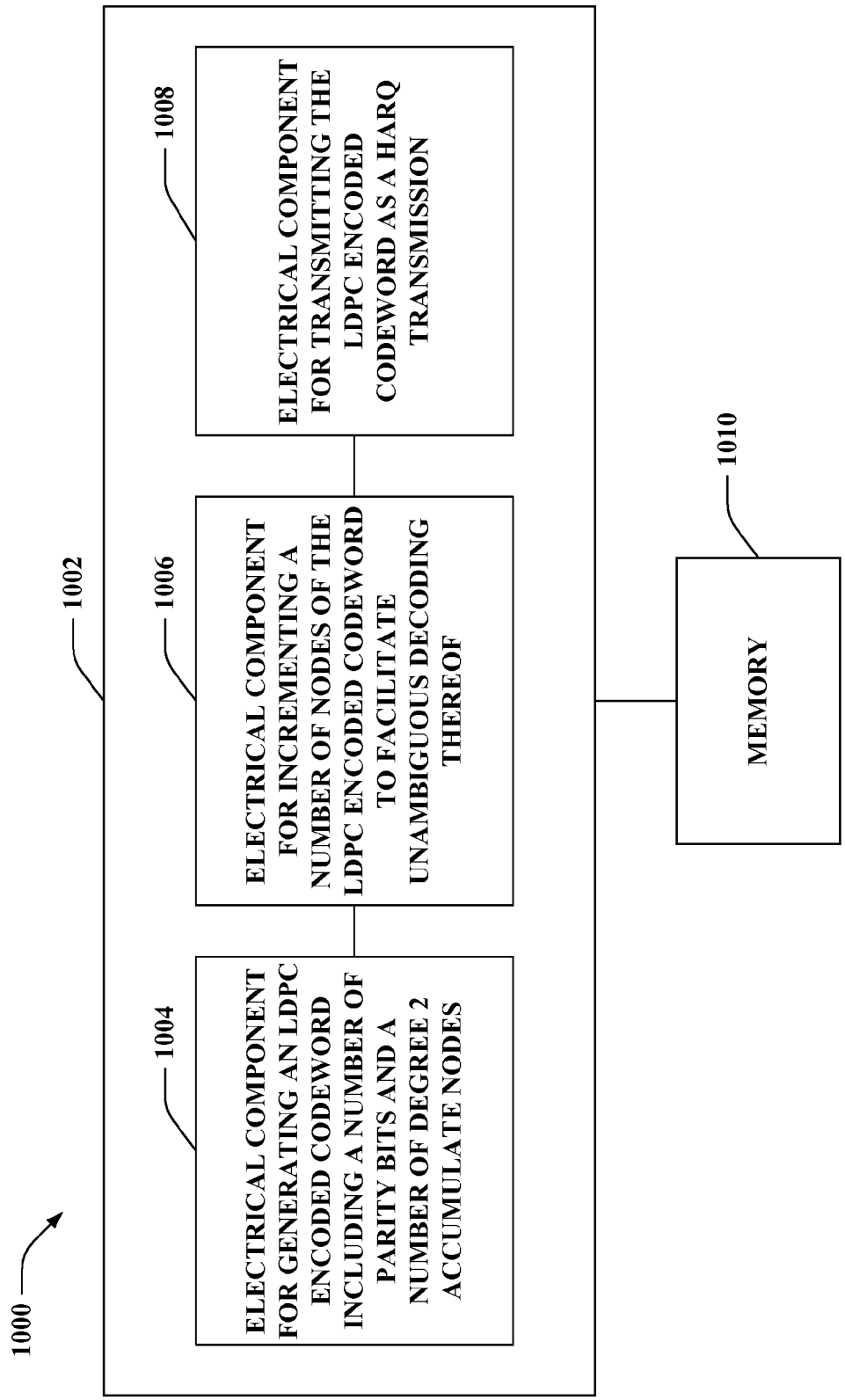
FIG. 10 is an illustration of an example system that transmits incremental codes.

With reference to FIG. 10, a system 1000 that transmits incremental LDPC encoded data is illustrated. For example, system 1000 can reside at least partially within a base station and/or mobile device. It is to be appreciated that system 1000 is represented as including functional blocks, which can be functional blocks that represent functions implemented by a processor, software, or combination thereof (e.g., firmware). System 1000 includes a logical grouping 1002 of electrical components that can act in conjunction. For instance, logical grouping 1002 can include an electrical component for generating an LDPC encoded codeword including a number of explicit parity bits and a number of core degree 2 accumulate nodes 1004. For example, as described a data segment desired for transmission can be mapped to variable nodes of a generated LDPC code with a number of other variable node bits being chosen to satisfy a set of constraints defining the code. In this regard, a device receiving the encoded signal can error correct the signal in some cases by predicting invalidly received nodes based in part on the LDPC constraints. Further, logical grouping 1002 can comprise an electrical component for incrementing a number of nodes of the LDPC encoded codeword to facilitate unambiguous decoding thereof 1006. For example, a receiving device can request additional nodes, for example, if the original LDPC encoded signal cannot be unambiguously decoded. Adding nodes to the LDPC encoded codewords can create a more constraints reducing ambiguity. Moreover, logical grouping 1002 can include an electrical component for transmitting the LDPC encoded codeword as a HARQ transmission 1008. As mentioned previously, the transmitted codeword can be the original codeword with the additional nodes added and/or a subsequent codeword, for example. Additionally, system 1000 can include a memory 1010 that retains instructions for executing functions associated with electrical components 1004, 1006, and 1008. While shown as being external to memory 1010, it is to be understood that one or more of electrical components 1004, 1006, and 1008 can exist within memory 1010.

Figure 11:
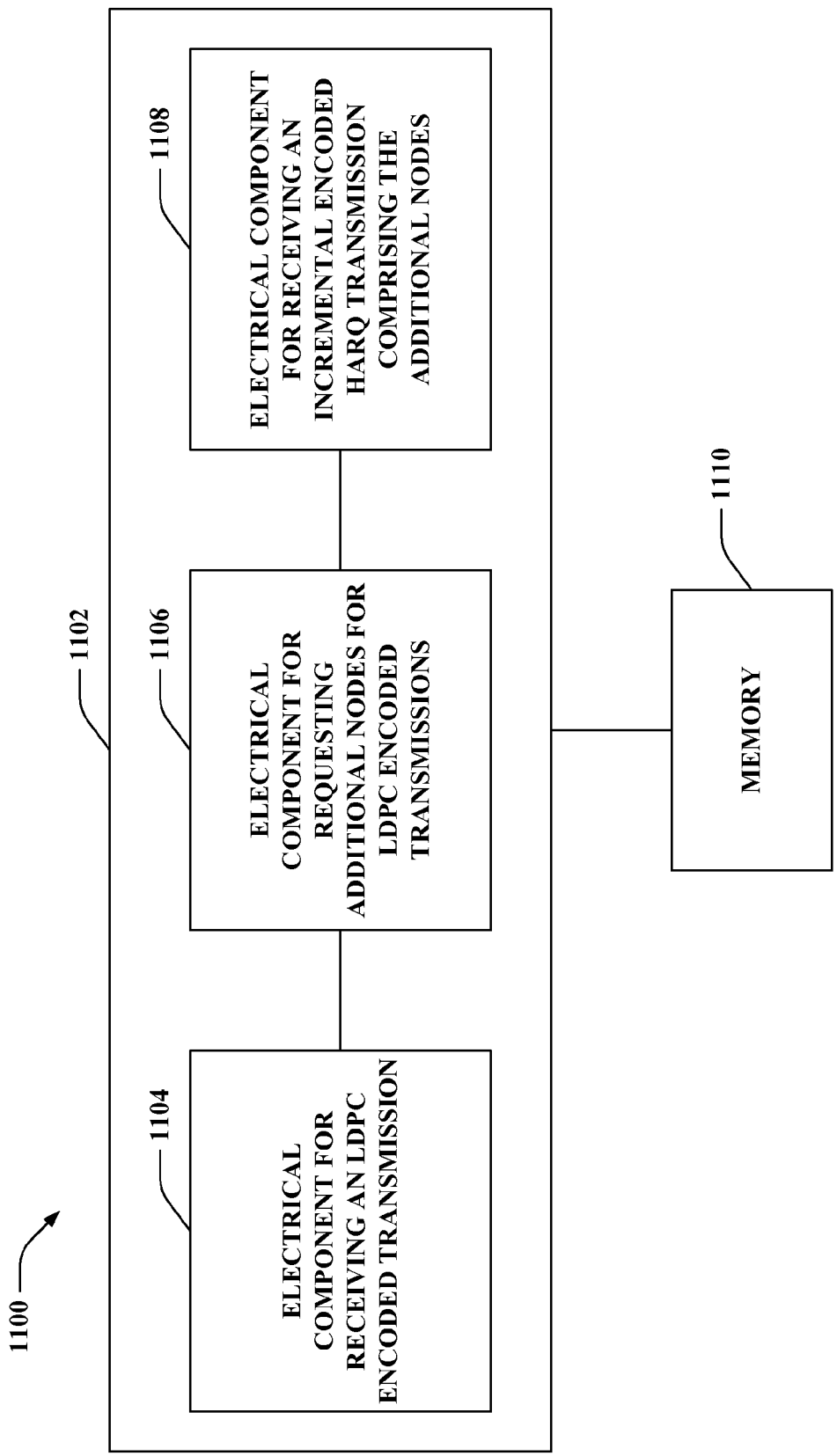
FIG. 11 is an illustration of an example system that receives and processes incremental codes.

Turning to FIG. 11, a system 1100 is displayed that facilitates receiving an LDPC encoded transmission (such as a HARQ transmission) and requesting additional nodes for the LDPC code. System 1100 can reside at least partially within a mobile device and/or base station, for instance. As depicted, system 1100 includes functional blocks that can represent functions implemented by a processor, software, or combination thereof (e.g., firmware). System 1100 includes a logical grouping 1102 of electrical components that facilitate controlling reverse link transmission. Logical grouping 1102 can include an electrical component for receiving an LDPC encoded transmission 1104. As described, this transmission can be encoded according to LDPC constraints such that exploiting the constraints can allow one or more erroneous or punctured nodes to be corrected or determined. Moreover, logical grouping 1102 can include an electrical component for requesting additional nodes for LDPC encoded HARQ transmissions 1106. As mentioned, the originally received transmission can have too many error nodes and/or too few correctly received nodes to too little reliability to be decoded properly. In this case, more nodes can be requested to add redundancy to the transmission, lessening the chance of an undecodable signal. In one example, multiple requests for additional nodes can be effectuated until the transmission can be properly received with unambiguous error correction. Further, logical grouping 1102 can comprise an electrical component for receiving an incremental LDPC encoded HARQ transmission comprising the additional nodes 1108. As described, this can be the current and/or a subsequent communication. Furthermore, system 1100 can include a memory 1110 that retains instructions for executing functions associated with electrical components 1104, 1106, and 1108. While shown as being external to memory 1110, it is to be understood that electrical components 1104, 1106, and 1108 can exist within memory 1110.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method that facilitates transmitting low-density parity-check (LDPC) encoded data, comprising:
    mapping a plurality of bits of a codeword to a plurality of nodes of a selected LDPC code;
    incrementing the number of nodes in the selected LDPC code to permit unambiguous error correcting of the LDPC code; and
    transmitting one of the selected LDPC code and the incremented LDPC code as a hybrid automatic repeat-request (HARQ) transmission;
    wherein the incrementing includes at least one of
        (a) adding one or more explicit parity bits and associated constraint nodes to the selected LDPC code, and
        (b) adding one or more core degree 2 accumulate nodes to the selected LDPC code while splitting an existing constraint node into two constraint nodes,
    and choosing (a), or (b), or (a) and (b), based on a chosen incrementing scheme.

2. The method of claim 1, the plurality of nodes of the selected LDPC code are core degree 3 nodes.

3. The method of claim 1, the selected LDPC code comprises one or more explicit parity bits connected to one or more constraint nodes and one or more core degree 2 accumulate nodes each connected to 2 constraint nodes.

4. The method of claim 1, the incrementing scheme is one of a predetermined scheme, or a scheme based on one of previous increment scheme selections, prediction of performance, and inference technology.

5. The method of claim 1, incrementing the number of nodes in the LDPC code based on low transmission power or a request from a receiving device.

6. The method of claim 1, wherein the selected and incremented LDPC codes are respectively portions of a larger predetermined LDPC code.

7. The method of claim 1, further comprising puncturing a number of nodes of the transmitted LDPC code to meet a desired packet size for the codeword.

8. A wireless communications apparatus, comprising:
at least one processor configured to increment a number of nodes of a low-density parity-check (LDPC) code that encodes a portion of a codeword to be transmitted; and
a memory coupled to the at least one processor;
wherein the at least one processor is further configured to perform at least one of
(a) adding an explicit parity bit and a corresponding constraint node to the LDPC code, and
(b) adding a core degree 2 accumulate node to the LDPC code while splitting an existing constraint node into two constraint nodes,
and to choose (a), or (b), or (a) and (b), based on a chosen incrementing scheme.

9. The wireless communications apparatus of claim 8, the at least one processor further configured to select one of a plurality of incrementing schemes for each of a plurality of incrementing steps.

10. The wireless communications apparatus of claim 9, the incrementing schemes are unique to the incrementing steps and are selected based at least in part on a predetermined configuration, a history of selections for previous codewords, performance prediction, or inference technology.

11. The wireless communications apparatus of claim 8, the at least one processor further configured to receive a request from a receiving device for additional nodes, and the number of nodes of the LDPC code are incremented based at least in part on the request.

12. The wireless communications apparatus of claim 8, the at least one processor further configured to perform a lifting on the LDPC code to meet a desired transmission packet size for transmitting the codeword as a hybrid automatic repeat-request (HARQ) transmission.

13. The wireless communications apparatus of claim 8, the at least one processor further configured to puncture or set to zero one or more of the nodes of the LDPC code to meet a desired packet size for transmitting the codeword.

14. A wireless communications apparatus that facilitates transmitting low-density parity check (LDPC) encoded data, comprising:
means for generating an LDPC encoded codeword including a number of core degree 2 accumulate nodes and core degree 3 variable nodes;
means for incrementing a number of nodes of the LDPC encoded codeword to permit unambiguous decoding of the LDPC code; and
means for transmitting one of the generated LDPC encoded codeword and the incremented LDPC encoded codeword as a hybrid automatic repeat-request (HARQ) transmission;
wherein the means for incrementing comprises means for at least one of
(a) adding an explicit parity bit and a corresponding constraint node to the generated LDPC code, and
(b) adding a core degree 2 accumulate node to the generated LDPC code while splitting an existing constraint node into one or more additional constraint nodes,
and means for choosing (a), or (b), or (a) and (b), based on a chosen incrementing scheme.

15. The wireless communications apparatus of claim 14, further comprising means for receiving a request to increase the number of nodes of the generated LDPC encoded codeword, and for increasing the number of nodes based at least in part on the request.

16. The wireless communications apparatus of claim 14, further comprising means for selecting incrementing schemes respectively for incrementing steps that increment the number of nodes of the generated LDPC encoded codeword.

17. The wireless communications apparatus of claim 14, a portion of the core degree 2 accumulate nodes and core degree 3 variable nodes are punctured.

18. The wireless communications apparatus of claim 17, the generated LDPC encoded codeword further comprises one or more explicit parity bits that represent a parity of some of the existing core degree 2 accumulate nodes and core degree 3 punctured or non-punctured variable nodes.

19. The wireless communications apparatus of claim 18, the one or more explicit parity bits being explicit parities of other bits where the core degree 3 punctured nodes are each represented in more explicit parity bits than the core degree 3 non-punctured variable nodes which are represented in more explicit parity bits than the core degree 2 accumulate nodes.

20. A non-transitory computer-readable storage medium comprising:
code for causing at least one computer to map a plurality of bits of a codeword to a plurality of nodes of a selected low-density parity-check (LDPC) code;
code for causing the at least one computer to increment the number of nodes in the selected LDPC code to permit unambiguous error correcting of the LDPC code;
code for causing the at least one computer to transmit one of the selected LDPC code and the incremented LDPC code as a hybrid automatic repeat-request (HARQ) transmission; and
code for causing the at least one computer to select an incrementing scheme that increments the number of nodes in the LDPC code by at least one of
(a) adding one or more explicit parity bits and associated constraint nodes to the selected LDPC code, and
(b) adding one or more core degree 2 accumulate nodes to the selected LDPC code while splitting an existing constraint node into two constraint nodes,
wherein the selected incrementing scheme specifies (a), or (b), or (a) and (b).

21. A wireless communication apparatus, comprising:
a processor configured to:
generate a low-density parity-check (LDPC) encoded codeword including a number of explicit parity bits and a number of core degree 2 accumulate nodes;
increment a number of nodes of the LDPC encoded codeword to permit unambiguous decoding thereof; and
transmit one of the generated LDPC encoded codeword and the incremented LDPC encoded codeword as a hybrid automatic repeat-request (HARQ) transmission; and
a memory coupled to the processor;
wherein the processor is further configured to perform at least one of (a) adding an explicit parity bit and a corresponding constraint node to the LDPC code, and (b) adding a core degree 2 accumulate node to the LDPC code while splitting a corresponding constraint node into two constraint nodes, and wherein the processor is further configured to choose (a), or (b), or (a) and (b), based on a chosen incrementing scheme.

22. A method for receiving and decoding a low-density parity-check (LDPC) encoded transmission, comprising:

receiving an LDPC encoded transmission where at least one node is received in error;

requesting an incremental LDPC encoded transmission comprising additional nodes to permit correct decoding of the transmission; and error correcting the incremental LDPC encoded transmission based in part on the additional nodes;

wherein the incremental LDPC encoded transmission is generated by at least one of (a) adding an explicit parity bit and a corresponding constraint node to the LDPC encoded transmission, and (b) adding a core degree 2 accumulate node to the LDPC encoded transmission while splitting an existing constraint node into one or more additional constraint nodes, and wherein (a), or (b), or (a) and (b), is chosen based on a chosen incrementing scheme.

23. The method of claim 22, the additional nodes create a further redundant LDPC code such that more information is transmitted to unambiguously error correct missing nodes.

24. The method of claim 22, the incremental LDPC encoded transmission is an incremented version of a disparate hybrid automatic repeat-request (HARQ) encoded transmission.

25. The method of claim 22, the LDPC encoded transmission comprises a plurality of explicit parity bits, core degree 2 accumulate bits, and core degree 3 variable nodes.

26. The method of claim 22, the LDPC encoded transmission is lifted to satisfy a desired packet size for the transmitted data.

27. The method of claim 22, the LDPC encoded transmission comprises one or more punctured nodes or nodes set to zero to satisfy a desired packet size for the transmitted data.

28. The method of claim 22, the request for the incremental LDPC encoded transmission occurs on a communication channel that is separate from a communication channel on which the LDPC encoded transmission is received.

29. A wireless communications apparatus, comprising:

at least one processor configured to receive a low-density parity-check (LDPC) encoded hybrid automatic repeat-request (HARQ) transmission having at least one error whose correction is ambiguous, and to request, in response to the at least one error, an incremental LDPC encoded HARQ transmission including additional nodes; and a memory coupled to the at least one processor;

wherein the at least one processor is further configured to receive and error correct the incremental LDPC encoded HARQ transmission, wherein the incremental LDPC encoded HARQ transmission is generated by at least one of (a) adding an explicit parity bit and a corresponding constraint node to the LDPC encoded HARQ transmission, and (b) adding a core degree 2 accumulate node to the encoded HARQ transmission while splitting an existing constraint node into one or more additional constraint nodes, and wherein (a), or (b), or (a) and (b), is chosen based on a chosen incrementing scheme.

30. The wireless communications apparatus of claim 29, the incremental LDPC encoded HARQ transmission is error corrected by satisfying a constraint associated with LDPC encoded HARQ transmission, the additional nodes create a further redundant LDPC code such that more information is transmitted to unambiguously error correct missing nodes.

31. The wireless communications apparatus of claim 29, the LDPC encoded HARQ transmission comprises a plurality of explicit parity bits, core degree 2 accumulate bits, and core degree 3 variable nodes.

32. The wireless communications apparatus of claim 29, wherein one of the LDPC encoded HARQ transmission and the incremental LDPC encoded HARQ transmission is lifted to satisfy a desired packet size for the transmitted data.

33. The wireless communications apparatus of claim 29, one of the LDPC encoded HARQ transmission and the incremental LDPC encoded HARQ transmission comprises one or more punctured nodes or nodes set to zero to satisfy a desired packet size for the transmitted data.

34. The wireless communications apparatus of claim 29, the at least one processor is further configured to request the incremental LDPC encoded HARQ transmission on a separate communication channel that is separate from a communication channel on which the LDPC encoded HARQ transmission is received.

35. A wireless communications apparatus for receiving low-density parity-check (LDPC) encoded transmissions, comprising:

means for receiving an LDPC encoded transmission;

means for requesting additional nodes for LDPC encoded transmissions; and means for receiving an incremental LDPC encoded hybrid automatic repeat-request (HARQ) transmission comprising the additional nodes;

wherein the incremental LDPC encoded HARQ transmission is generated by at least one of (a) adding an explicit parity bit and a corresponding constraint node to the LDPC encoded transmission, and (b) adding a core degree 2 accumulate node to the LDPC encoded transmission while splitting an existing constraint node into one or more additional constraint nodes, and wherein (a), or (b), or (a) and (b), is chosen based on a chosen incrementing scheme.

36. The wireless communications apparatus of claim 35, further comprising means for error correcting nodes of the incremental LDPC encoded HARQ transmission received in error based at least in part on the additional nodes.

37. The wireless communications apparatus of claim 36, the error correcting is performed based at least in part on satisfying a constraint of the incremental LDPC encoded HARQ transmission.

38. The wireless communications apparatus of claim 35, wherein the incremental LDPC encoded HARQ transmission comprises the LDPC encoded transmission and bits associated with the additional nodes.

39. The wireless communications apparatus of claim 35, further comprising means for decoding the incremental LDPC encoded HARQ transmission.

40. The wireless communications apparatus of claim 35, the LDPC encoded transmission and the incremental LDPC encoded HARQ transmission comprise a plurality of explicit parity bits, core degree 2 accumulate bits, and core degree 3 variable nodes.

41. The wireless communications apparatus of claim 35, the LDPC encoded transmission and the incremental LDPC encoded HARQ transmission are lifted to satisfy a desired packet size for transmitted data.

42. The wireless communications apparatus of claim 35, the LDPC encoded transmission and the incremental LDPC encoded HARQ transmission comprise one or more puncture nodes to satisfy a desired packet size for transmitted data.

43. The wireless communications apparatus of claim 35, wherein the additional nodes are requested on a communication channel that is separate from a communication channel on which the LDPC encoded HARQ transmission is received.

44. A non-transitory computer-readable storage medium comprising:
 code for causing at least one computer to receive a low-density parity-check (LDPC) encoded transmission where at least one node is received in error;
 code for causing the at least one computer to request an incremental LDPC encoded transmission comprising additional nodes to add more constraint to the transmission; and
 code for causing the at least one computer to error correct the incremental LDPC encoded transmission based on the additional nodes;
 wherein the incremental LDPC encoded transmission is generated by at least one of
  (a) adding an explicit parity bit and a corresponding constraint node to the LDPC encoded transmission, and
  (b) adding a core degree 2 accumulate node to the LDPC encoded transmission while splitting an existing constraint node into one or more additional constraint nodes,
 and wherein (a), or (b), or (a) and (b), is chosen based on a chosen incrementing scheme.

45. The non-transitory computer-readable storage medium of claim 44, the additional nodes create a tighter LDPC code such that fewer nodes are needed to unambiguously error correct missing nodes.

46. A wireless communication apparatus, comprising:
 a processor configured to:
  receive a low-density parity-check (LDPC) encoded transmission;
  request additional nodes for LDPC encoded transmissions; and
  receive an incremental LDPC encoded transmission comprising the additional nodes; and
 a memory coupled to the processor;
 wherein the incremental LDPC encoded transmission is generated by at least one of
  (a) adding an explicit parity bit and a corresponding constraint node to the LDPC encoded transmission, and
  (b) adding a core degree 2 accumulate node to the LDPC encoded transmission while splitting an existing constraint node into one or more additional constraint nodes,
 and wherein (a), or (b), or (a) and (b), is chosen based on a chosen incrementing scheme.

\* \* \* \* \*